(12) United States Patent
Martens et al.

(10) Patent No.: US 7,068,046 B2
(45) Date of Patent: Jun. 27, 2006

(54) CALIBRATION TECHNIQUES FOR SIMPLIFIED HIGH-FREQUENCY MULTIPORT DIFFERENTIAL MEASUREMENTS

(75) Inventors: Jon Martens, San Jose, CA (US); David Judge, Peterborough, NH (US); Jimmy Bigelow, Castroville, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 10/992,295

(22) Filed: Nov. 18, 2004

(65) Prior Publication Data

US 2006/0103392 A1 May 18, 2006

(51) Int. Cl.
*G01R 35/00* (2006.01)
*G01R 27/04* (2006.01)

(52) U.S. Cl. .................................. 324/601; 324/638

(58) Field of Classification Search ............. 324/601, 324/600, 74, 76.11, 76.19, 202, 130, 637, 324/638, 646, 534; 702/65, 85, 117
See application file for complete search history.

(56) References Cited

U.S. PATENT DOCUMENTS

| | | | | |
|---|---|---|---|---|
| 5,578,932 A | * | 11/1996 | Adamian | 324/601 |
| 6,417,674 B1 | * | 7/2002 | Rowell et al. | 324/601 |
| 6,653,848 B1 | * | 11/2003 | Adamian et al. | 324/638 |
| 6,853,198 B1 | * | 2/2005 | Boudiaf et al. | 324/601 |
| 6,882,160 B1 | * | 4/2005 | Martens et al. | 324/601 |
| 6,928,373 B1 | * | 8/2005 | Martens et al. | 702/65 |
| 2004/0201383 A1 | * | 10/2004 | Anderson | 324/600 |
| 2004/0246004 A1 | * | 12/2004 | Heuermann | 324/601 |
| 2005/0030047 A1 | * | 2/2005 | Adamian | 324/650 |

* cited by examiner

*Primary Examiner*—Anjan Deb
*Assistant Examiner*—Hoai-An D. Nguyen
(74) *Attorney, Agent, or Firm*—Fliesler Meyer LLP

(57) ABSTRACT

Embodiments of the present invention are directed towards systems, methods, and computer readable media for performing multiport vector network analysis. Embodiments of the present invention relate to a multiport network analysis that is derived from a family of two port calibration techniques including Thru/Reflect/Line (TRL), Thru/Reflect/Match (TRM), Line/Reflect/Line (LRL), Line/Reflect/Match (LRM) and several others. An improved calibration method enables the use of a simplified switch matrix to perform accurate vector network analysis in communications and networking systems. After determining some characteristics through conventional methods, a two tier load match correction is performed on the results. The improved correction mechanism enables the system to perform comparably to systems with more complicated switch matrices.

18 Claims, 6 Drawing Sheets

CALIBRATION TECHNIQUES FOR SIMPLIFIED HIGH-FREQUENCY MULTIPORT DIFFERENTIAL MEASUREMENTS

FIELD OF THE INVENTION

The present invention deals generally with improved techniques for performing multiport vector network analysis. The present invention relates more specifically to an improved method for calibrating such methods.

BACKGROUND OF THE INVENTION

Multiport and differential Vector Network Analyzer (VNA) measurements are used in a wide variety of communications applications. The purpose of a vector network analyzer is to measure the magnitude and phase of the reflection and transmission characteristics of a microwave component as functions of frequency. A component can be inserted between the test ports, the test signal is rapidly tuned over a span of frequency, and portions of this signal are reflected from and transmitted through the component. These measurements are critical for accurately analyzing the characteristics of equipment such as telecommunications and data components, gigabit Ethernet backplanes, and other devices. However, as multiport measurements are attempted at higher frequencies on these devices, the process of maintaining accuracy becomes more difficult.

One approach for performing these measurements consists of placing a six switch fabric (arrangement of switches), for multiplexing in front of a receiver and source matrix, which can be part of a 2-port VNA. In this case a series of 2 port calibrations are renormalized against the off-state impedances of the various switches before combining their signals. For lower frequencies this approach works well, but for higher frequencies (above 50 GHz) the insertion loss becomes intolerably high (greater than 10–15 dB at 60 GHz). In an alternate approach the test couplers are moved out to the test ports, but a similar switch fabric is used. However, such a system can also have similar insertion loss problems and be prohibitively expensive. Simplified switch fabrics have been identified but major changes are needed to traditional calibration techniques to ensure measurement accuracy when using such fabrics. What is needed is an improved calibration system that can enable the use of a switch fabric design that has low insertion loss, is easy to construct.

DETAILED DESCRIPTION

Embodiments of the present invention are directed towards systems, methods, and computer readable media for performing multiport vector network analysis. Embodiments of the present invention relate to a multiport network analysis calibration technique that is derived from a family of two port calibration techniques including Thru/Reflect/Line (TRL), Thru/Reflect/Match (TRM), Line/Reflect/Line (LRL), Line/Reflect/Match (LRM) and others. An improved calibration method enables a simplified switch matrix to perform accurate vector network analysis in communications and networking systems. After determining some characteristics through conventional methods, a two tier load match correction is performed on the results. The improved correction mechanism enables the system to perform comparably to systems with more complicated switch matrices.

Figure 1:
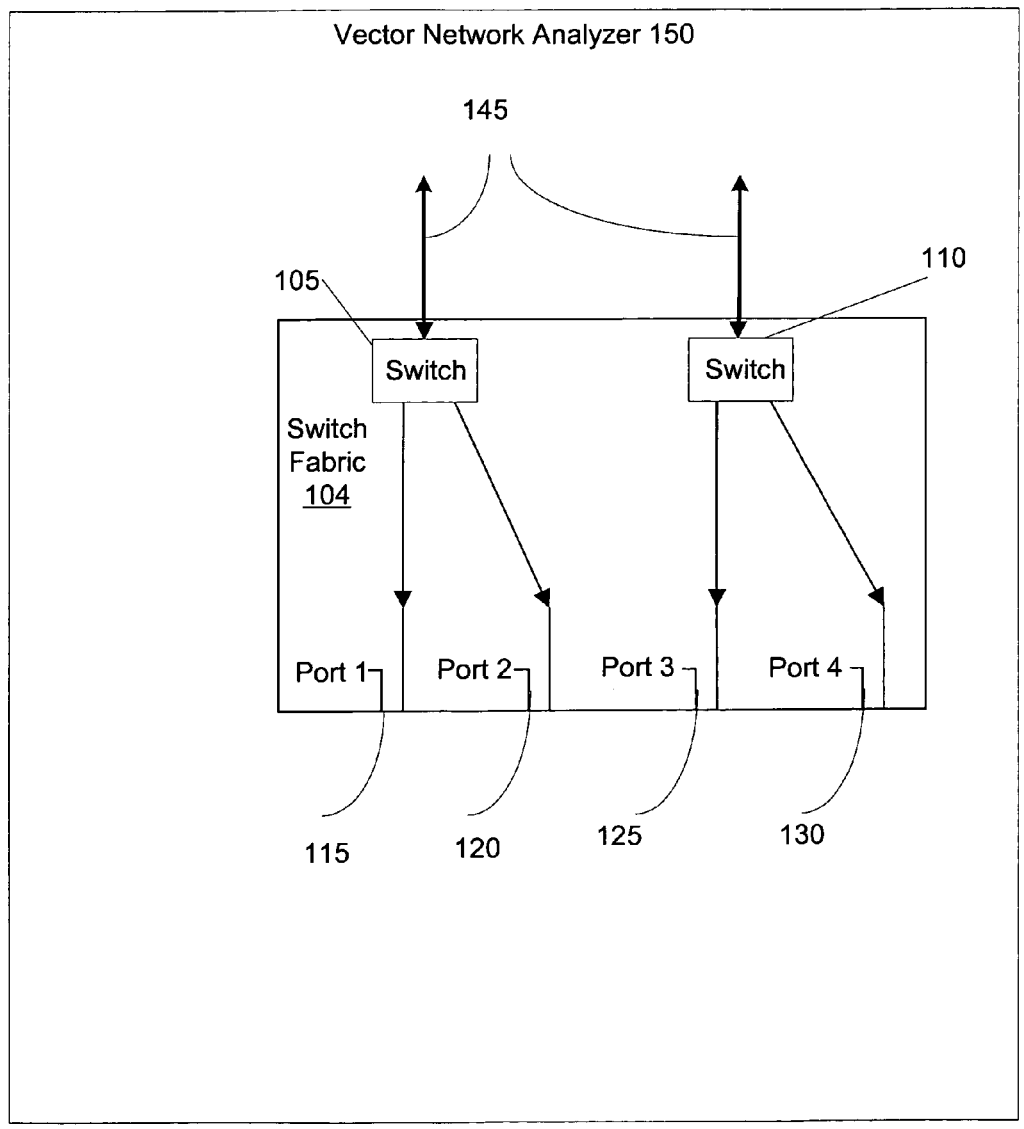
FIG. 1 is a switch fabric for a vector network analyzer in accordance with one embodiment of the present invention.

FIG. 1 illustrates a switch fabric 104 for a vector network analyzer in accordance with one embodiment of the present invention. The vector network analyzer comprises a pair of inputs 145 that transmit and receive a signal to be analyzed. When a device under test is connected to the onboard switch ports 115, 120, 125, and 130, a signal is applied to each port in succession, and the reflected and transmitted waves are reflected through the switch fabric 104 and received by the ports 145. The switch fabric 104 is then switched, using switches such as 105 and 110, to allow measurement of all combination of driving ports and receiving ports 115, 120, 125 and 130.

The inputs can be preceded by a source matrix that modifies and otherwise filters the signal from the tested component. The switch fabric also includes the four outboard ports 115, 120, 125, 130, which can also be referred to herein as ports 1, 2, 3, and 4 respectively. Each of the outboard ports includes an switch that can be terminated or non-terminated. The vector network analyzer includes either specialized or general purpose hardware and/or software for processing the results of the outputs of the switch fabric. The methods applied by the software and hardware of the vector network analyzer are discussed in greater detail below.

In the present embodiment, the vector network analyzer 150 includes the 2 Single Poll Double Throw (SPDT) switches 105 and 110 that receive each of the inputs and provide outputs to the receiver matrix. Additional switches for receiver multiplexing can be in the vector network analyzer 150 or may be external.

The illustrated vector network analyzer can be set to measure two 2 S-parameters per switch configuration to avoid match inconsistencies. S-parameter measurement is the standard method for device characterization over a very wide range of frequencies, from less than 1 MHz to above 40 GHz.

S-parameters of a multi-port device characterize how the device interacts with signals presented to the various ports of the device. An exemplary S-parameter is "S12" (often shown as "S12"). The first number is the port that the signal is leaving, while the second is the port that the signal is being injected into. S12, therefore, is the signal leaving port 1 relative to the signal being injected into port 2. The four S-parameters associated with a two-port arrangement are:

S11 is referred to as the "forward reflection" coefficient or the reflection coefficient of port 1, which is the signal leaving port 1 relative to the signal being injected into port 1;

S21 is referred to as the "forward transmission" coefficient, which is the signal leaving port 2 relative to the signal being injected into port 1;

S22 is referred to as the "reverse reflection" coefficient or the reflection coefficient for port 2, which is the signal leaving port 2 relative to the signal being injected into port 2; and S12 is referred to as the "reverse transmission" coefficient, which is the signal leaving port 1 relative to the signal being injected into port 2.

However, determining the S parameters for equipment to be tested requires that a calibration method be performed to account for the changing load matches due to the differing state of the switches. The calibration performed below can be performed by software or hardware stored within the vector network analyzer 150 or an external calibration device. In some embodiments, a specialized calibration tool, either internal or external to the vector network analyzer 150 is used. The calibration tool can include any combination of hardware, software, or firmware for performing the analysis below.

A conventional LRM, TRL, LRL, or TRM two port analysis, or any other two port analysis can be used to calculate the following calibration terms with the numbers referring to the port or ports from among ports 1–4 for which the values are calculated.

| | |
|---|---|
| ed1, ed2, ed3 and ed4 | the directivity terms |
| ep1S, ep2S, ep3S, and ep4S | the source match terms |
| et11, et22, et33, and et44 | the reflection tracking terms |
| et13, et31, et24, and et42: | some of the transmission tracking terms |

For the purposes of this analysis the calculations can be performed by performing a pair of disjointed two port calibrations, the first calibration including ports 1 and 3 and the second calibration including ports 2 and 4. These analyses and the tools used to implement them are well known in the art and are discussed in greater detail in the following references that are incorporated by reference herein in their entirety:

A. Ferrero, U. Pisani, and K. J. Kerwin, "A new implementation of a multiport automatic network analyzer," *IEEE Trans. Microwave Theory Tech.*, vol. 40, pp. 2078–2085, November 1992.

A. Ferrero, F. Sanpietro, and U. Pisani, "Multiport vector network analyzer calibration," *IEEE Trans. Microwave Theory Tech.*, vol. 42, pp. 2455–2461, December 1994.

H. Eul and B. Schiek, "A generalized theory and new calibration procedures for network analyzer self-calibration," *IEEE Trans. Microwave Theory Tech.*, vol. 39, pp. 724–731, April 1991.

Figure 2:
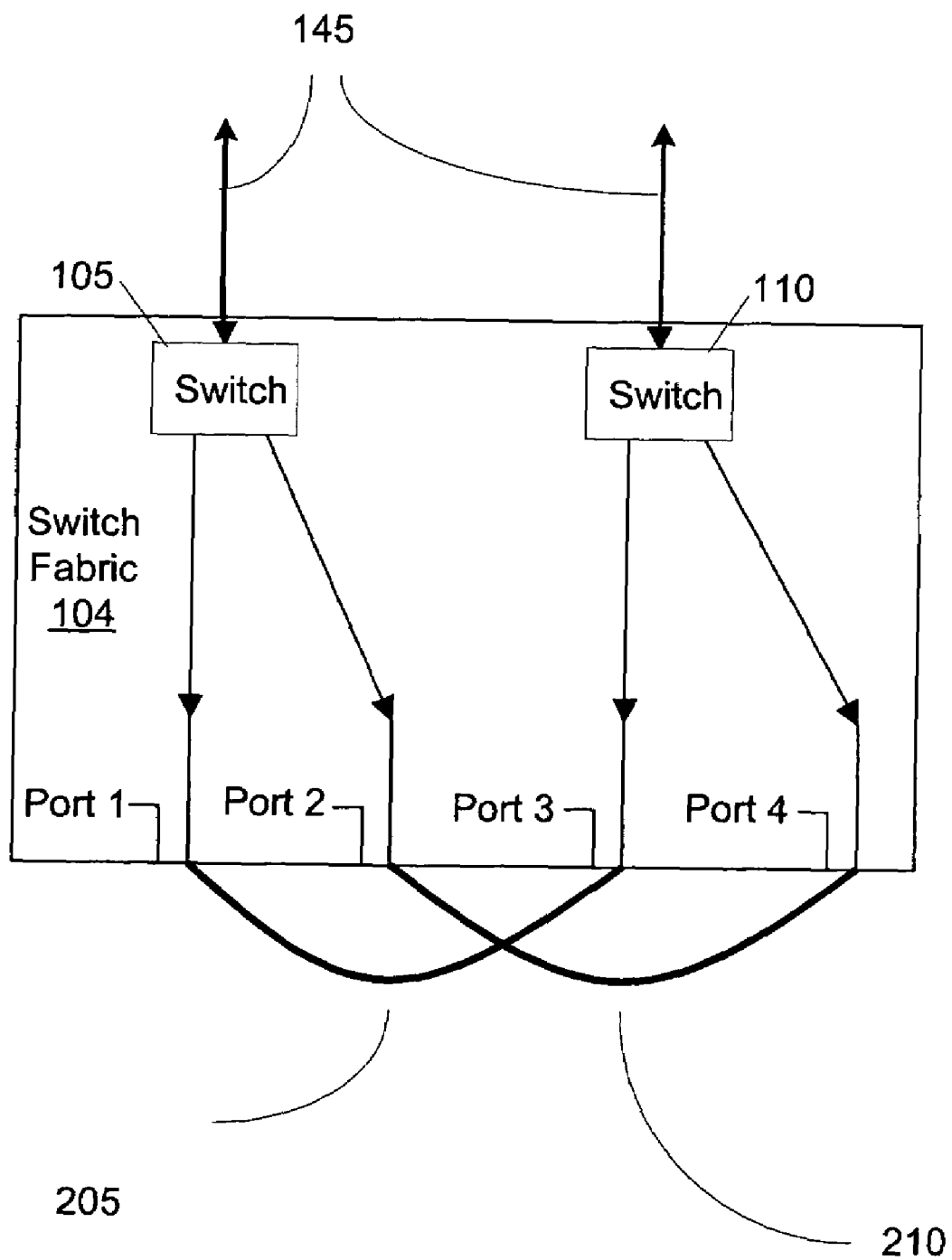
FIG. 2 illustrates the switch fabric with additional lines used for calibration.

In the next step of the calibration, various outboard switches (see below) are terminated and the first outboard port 115 is connected via line 13 (illustrated as 205) to the third outboard port 125 and the second outboard port 120 is connected via line 24 (illustrated as 210) to the fourth outboard port 135 as illustrated with respect to FIG. 2. The following reflection S measurements should be taken to determine load matching:

S11 with the outboard port 3 switch in the terminated position

S33 with the outboard port 1 switch in the terminated position

S22 with the outboard port 4 switch in the terminated position

S44 with the outboard port 2 switch in the terminated position

After measuring these values, port corrections can be performed, utilizing the values determined during the two port calibration steps. A modified S' version of the result from an $i^{th}$ port can be given by $$S'_{ii} = \frac{S_{ii} - edi}{etii + epiS \cdot (S_{ii} - edi)}$$

This step provides corrected measurements $S'_{11}$ through $S'_{44}$.

Next, the behavior of the lines 205, 210 can be separated or de-embedded from the reflection results to produce a load match for the outbound ports when terminated. The load match for a port i is referred to herein as epiL.

The behavior of the lines 205, 210 can be known a priori or calculated during the two port calibration. A de-embedding function for the line 205, when applied to S11' and S33' produces ep3L and ep1L respectively. The de-embedding function for the line 210, when applied to S22' and S44' produces ep4L and ep2L.

In the next step, the transmission terms for the calibration that were determined during the LRM/LRL calibration can be revised based on the new load match terms. Additionally, transmission coefficient measurements should be taken in both directions to obtain transmission coefficients for each pair of connected ports. The following equations illustrate how the original transmission tracking measurements can be modified. The line 13 notation indicates that the measurement is made with line 13 connected and the non driving port terminated.

$$et31 = S_{31}^{line13\_term}(1-ep1S \cdot ep3L)$$

$$et13 = S_{13}^{line13\_term}(1-ep3S \cdot ep1L)$$

$$et42 = S_{42}^{line24\_term}(1-ep2S \cdot ep4L)$$

$$et24 = S_{24}^{line24\_term}(1-ep4S \cdot ep2L)$$

If port 1 is connected to port 4 and port 2 is connected to port 3, and the two-port calibration, reflection coefficient measurement and correction, and de-embedding process above is repeated, load match values can be obtained that can be used to calculate et14, et41, et23 and et32.

$$et41 = S_{41}^{line14\_term}(1-ep1S \cdot ep4L)$$

$$et14 = S_{14}^{line14\_term}(1-ep4S \cdot ep1L)$$

$$et32 = S_{32}^{line23\_term}(1-ep2S \cdot ep3L)$$

$$et23 = S_{23}^{line23\_term}(1-ep3S \cdot ep2L)$$

Finally, by connecting ports 1 and 2 and ports 3 and 4 and repeating the process again, et12, et21, et34, and et43 can be determined with the following equations expressing them:

$$et21 = S_{21}^{line12\_term}(1-ep1S \cdot ep2L)$$

$$et12 = S_{24}^{line12\_term}(1-ep2S \cdot ep1L)$$

$$et34 = S_{34}^{line43\_term}(1-ep4S \cdot ep3L)$$

$$et43 = S_{24}^{line43\_term}(1-ep3S \cdot ep4L)$$

These last four tracking terms can also be determined by other methods, including redundancy. These steps provide a complete set of calibration coefficients for the system. These calibration coefficients can then be used to configure the VNA 150 for future testing operations.

Figure 3:
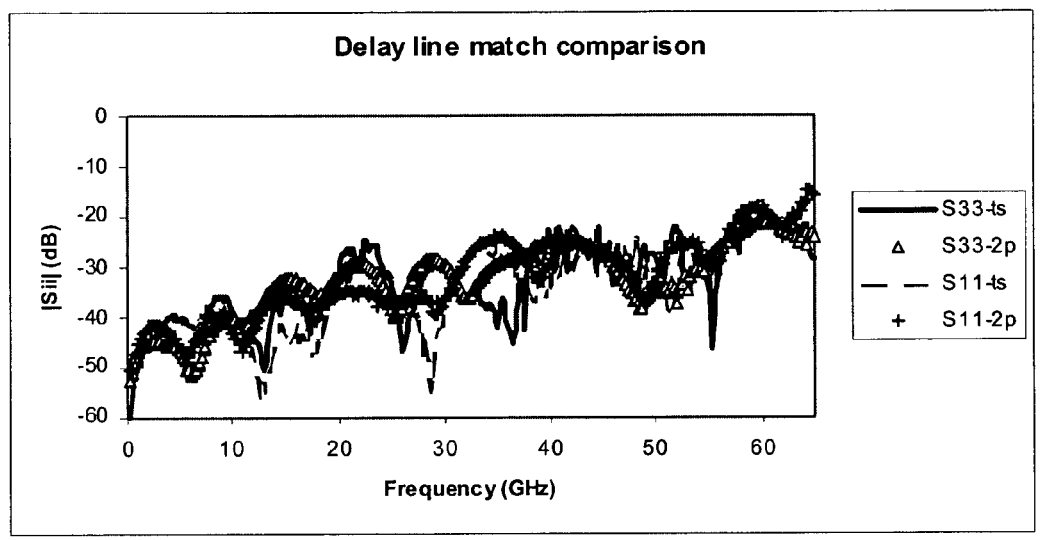
FIG. 3 is a graph illustrating delay line measurements for embodiments of the present invention compared to conventional implementations.

FIG. 3 is a graph illustrating delay line measurements for embodiments of the present invention compared to conventional implementations. For the measurements illustrated in FIG. 3 a four port LRM calibration from 40 Mhz to 65 GHz was performed. A delay line of 2.4 cm was measured using a consistent termination state and the multi-tier calibration process described above. The results are overlayed with those from a conventional 2 port LRM calibration. The curves marked "2p" use conventional embodiments whereas the curves labeled "ts" use embodiments of the present invention. As seen in the figure, the embodiment of the present invention matches the measurement of the conventional embodiment closely, despite its simplified structure.

Figure 4:
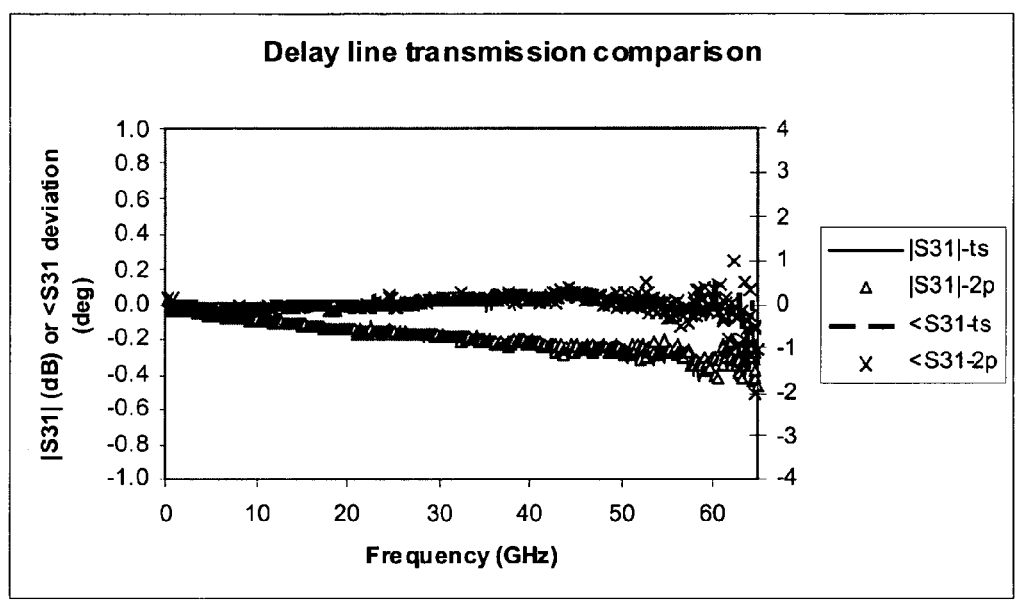
FIG. 4 illustrates phase measurements of delay lines of embodiments of the present invention compared to phase measurements of conventional implementations.

FIG. 4 illustrates phase measurements of delay lines of embodiments of the present invention compared to phase measurements of conventional implementations. The figure uses a similar construct and identical legend to FIG. 3 and illustrates a deviation from a linear phase. As seen in the figure, the embodiment of the present invention matches the measurements of the conventional embodiment closely, despite its simplified structure.

With both FIG. 3 and FIG. 4 the measurement loss differences of the two systems is well within measurement uncertainty.

Figure 5A:
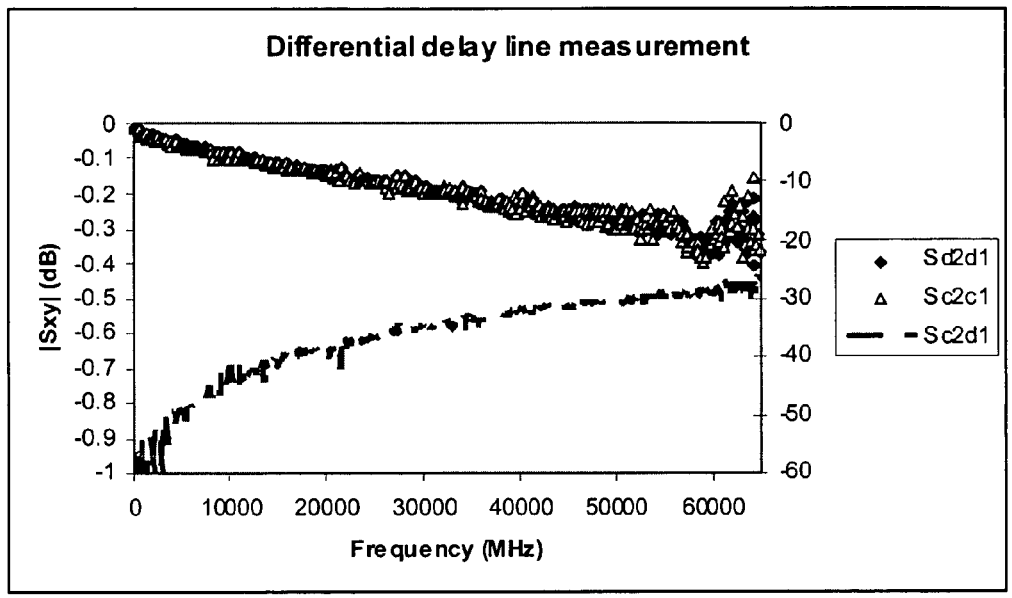
FIG. 5 illustrates measurements for a differential delay line for an embodiment of the present invention and a conventional implementation.
Figure 5B:
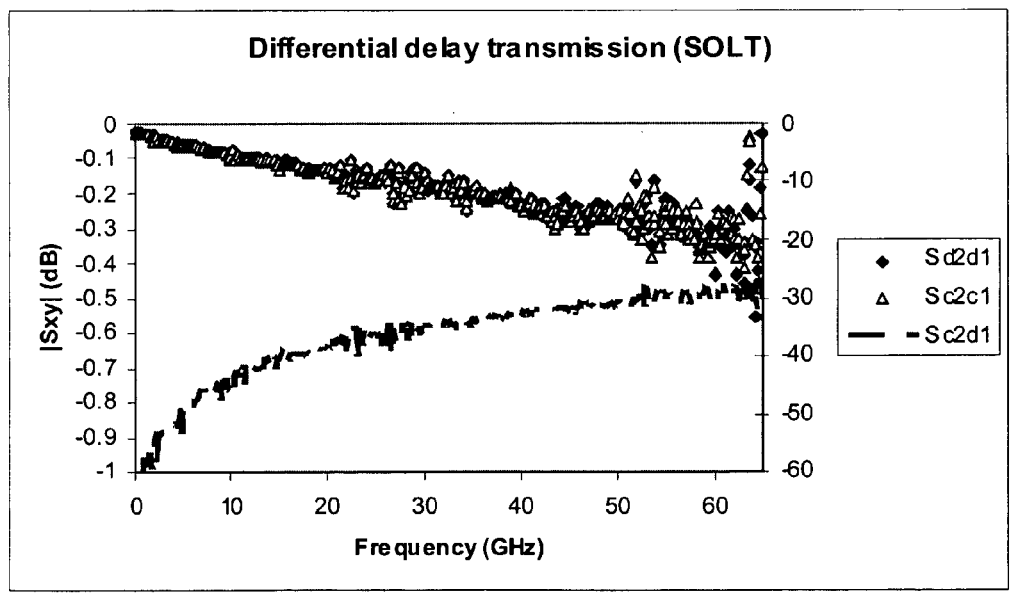

FIGS. 5A and 5B illustrate measurements for a differential delay line for an embodiment of the present invention and a conventional implementation. The results produced by an embodiment of the present invention are illustrated in FIG. 5A and the results produced by a 4 port Short Open Load Through (SOLT) switch is illustrated for comparison in FIG. 5B. Aside from minor variations, an embodiment of the present invention matches closely to the SOLT implementation despite it simplified construction.

Figure 6:
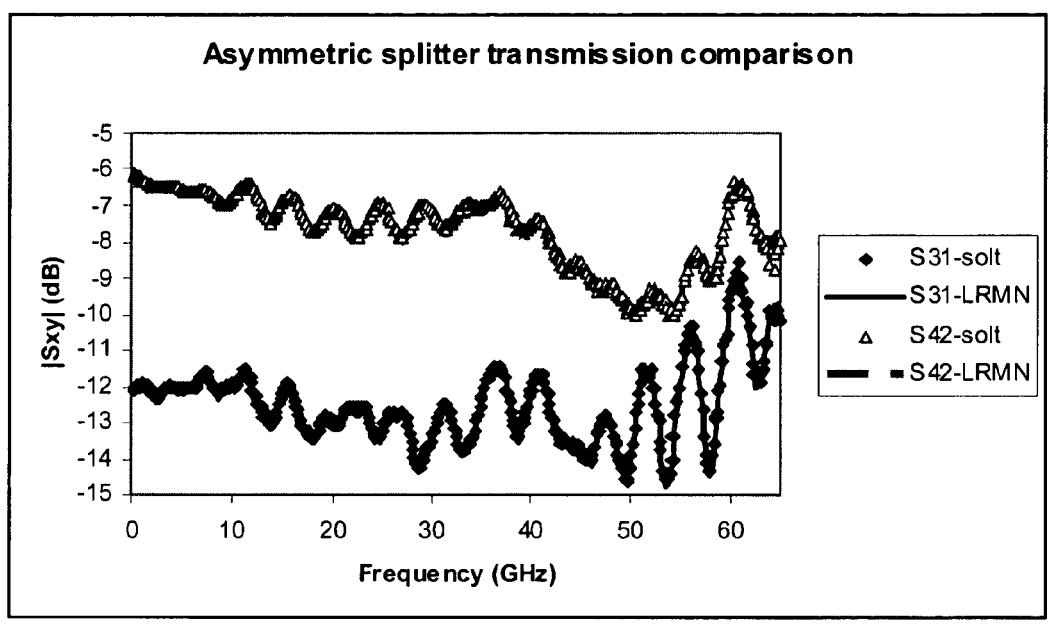
FIG. 6 illustrates comparisons of asymmetric splitter performance for an embodiment of the present invention and a conventional implementation.

FIG. 6 illustrates comparisons of measurements of an asymmetric splitter for an embodiment of the present invention and a conventional implementation. For the results illustrated in FIG. 6 an asymmetric splitter is tested in a single-ended fashion. As in the previous example, the embodiments of the present invention (illustrated as LRMN) are compared to a SOLT 4 port system. The match on all ports was within −10 dB and port-to-port transmission varied between 6 and 20 DB. Aside from minor variations, an embodiment of the present invention matches closely to the SOLT implementation despite it simplified construction.

Other features, aspects and objects of the invention can be obtained from a review of the figures and the claims. It is to be understood that other embodiments of the invention can be developed and fall within the spirit and scope of the invention and claims.

The foregoing description of preferred embodiments of the present invention has been provided for the purposes of illustration and description. It is not intended to be exhaustive or to limit the invention to the precise forms disclosed. Obviously, many modifications and variations will be apparent to the practitioner skilled in the art. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

In addition to an embodiment consisting of specifically designed integrated circuits or other electronics, the present invention may be conveniently implemented using a conventional general purpose or a specialized digital computer or microprocessor programmed according to the teachings of the present disclosure, as will be apparent to those skilled in the computer art.

Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art.

The present invention includes a computer program product which is a storage medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

Stored on any one of the computer readable medium (media), the present invention includes software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, and user applications.

Included in the programming (software) of the general/specialized computer or microprocessor are software modules for implementing the teachings of the present invention.

What is claimed is:

1. A method for calibrating a vector network analyzer, the vector network analyzer having a switch fabric with at least four outboard ports the method comprising:
   determining a first group of calibration terms by performing at least two two-port calibrations on the outboard ports;
   measuring reflection coefficients for each member of a first pair of outboard ports from the at least four outboard ports when the first pair is connected with a first transmission line;
   measuring reflection coefficients for each member of a second pair of outboard ports from the at least four outboard ports when the second pair is connected with a second transmission line; and
   utilizing the first group of calibration terms and the reflection coefficients from the first and second pairs to calibrate the vector network analyzer, wherein utilizing the first group of calibration terms and the reflection coefficients from the first and second pairs comprises:
      determining load match values from the reflection coefficients from the first and second pairs and utilizing the load match values; and
      determining a second group of calibration terms from the load match values and the first group of calibration terms.

2. The method of claim 1, wherein the second group of calibration terms comprises transmission tracking terms.

3. The method of claim 1, wherein determining load match values for the first pair comprises de-embedding characteristics of the first line from a corrected version of the reflection coefficients for the first pair.

4. The method of claim 3, wherein the corrected version of the reflection coefficients is provided by the following expression:

$$S'_{ii} = \frac{S_{ii} - edi}{etii + epiS \cdot (S_{ii} - edi)}$$

wherein i is a number of a port being measured, edi is a directivity term for the port from among the first group of calibration terms, etii is a reflection tracking term for the port from among the first group of calibration terms, $S_{ii}$ is a measured reflection coefficient for the port, and epiS is a source match term for the port from among the first group of calibration terms.

5. The method of claim 1, wherein the first group of calibration terms comprises directivity terms, source match terms, reflection tracking terms, and some transmission tracking terms.

6. The method of claim 1, wherein determining the second group of calibration terms from the load match values and the first group of calibration terms comprises:
modifying the first group of calibration terms according to the load match values to generate a modified first group of calibration terms; and
utilizing the load match values and the modified first group of calibration terms to determine the second group of calibration terms.

7. A machine readable medium comprising instructions that when executed by a processor cause a system to:
determine a first group of calibration terms by performing at least two two-port calibrations on outboard ports of a switch fabric having at least four outboard ports;
measure reflection coefficients for each member of a first pair of outboard ports from the at least four outboard ports when the first pair is connected with a first transmission line;
measure reflection coefficients for each member of a second pair of outboard ports from the at least four outboard ports when the second pair is connected with a second transmission line; and
utilize the first group of calibration terms and the reflection coefficients from the first and second pairs to calibrate the vector network analyzer, wherein the instructions that when executed by the processor cause the system to utilize the first group of calibration terms and the reflection coefficients from the first and second pairs comprise instructions that when executed by the processor cause the system to:
determine load match values from the reflection coefficients from the first and second pairs and utilize the load match values; and
determine a second group of calibration terms from the load match values and the first group of calibration terms.

8. The machine readable medium of claim 7, wherein the first group of calibration terms comprises directivity terms, source match terms, reflection tracking terms, and some transmission tracking terms.

9. The machine readable medium of claim 7, wherein the second group of calibration terms comprises tracking terms.

10. The machine readable medium of claim 7, wherein the instructions that when executed by the processor cause the system to determine the second group of calibration terms from the load match values and the first group of calibration terms comprise instructions that when executed by the processor cause the system to:
modify the first group of calibration terms according to the load match values to generate a modified first group of calibration terms; and
utilize the load match values and the modified first group of calibration terms to determine the second group of calibration terms.

11. The machine readable medium of claim 7, wherein the instructions that when executed by the processor cause the system to determine load match values for the first pair comprise instructions that when executed by the processor cause the system to de-embed characteristics of the first line from a corrected version of the reflection coefficients for the first pair.

12. The machine readable medium of claim 11, wherein the corrected version of the reflection coefficients is provided by the following expression:

$$S'_{ii} = \frac{S_{ii} - edi}{etii + epiS \cdot (S_{ii} - edi)}$$

wherein i is a number of a port being measured, edi is a directivity term for the port from among the first group of calibration terms, etii is a reflection tracking term for the port from among the first group of calibration terms, $S_{ii}$ is a measured reflection coefficient for the port, and epiS is a source match term for the port from among the first group of calibration terms.

13. A calibration tool for calibrating a vector network analyzer having a switch fabric with at least four outboard ports, the calibration tool configured to:
determine a first group of calibration terms by performing at least two two-port calibrations on the outboard ports;
measure reflection coefficients for each member of a first pair of outboard ports from the at least four outboard ports when the first pair is connected with a first transmission line;
measure reflection coefficients for each member of a second pair of outboard ports from the at least four outboard ports when the second pair is connected with a second transmission line; and
utilize the first group of calibration terms and the reflection coefficients from the first and second pairs to calibrate the vector network analyzer, wherein the calibration tool, when utilizing the first group of calibration terms and the reflection coefficients from the first and second pairs:
determines load match values from the reflection coefficients from the first and second pairs and utilizes the load match values; and
determines a second group of calibration terms from the load match values and the first group of calibration terms.

14. The calibration tool of claim 13, wherein the calibration tool, when determining load match values for the first pair is configured to de-embed characteristics of the first line from a corrected version of the reflection coefficients for the first pair.

15. The calibration tool of claim 13, wherein the corrected version of the reflection coefficients is provided by the following expression:

$$S'_{ii} = \frac{S_{ii} - edi}{etii + epiS \cdot (S_{ii} - edi)}$$

wherein i is a number of a port being measured, edi is a directivity term for the port from among the first group of calibration terms, etii is a reflection tracking term for the port from among the first group of calibration terms, $S_{ii}$ is a measured reflection coefficient for the port, and epiS is a source match term for the port from among the first group of calibration terms.

16. The calibration tool of claim 13, wherein the first group of calibration terms comprises directivity terms, source match terms, reflection tracking terms, and some transmission tracking terms.

17. The calibration tool of claim 13, wherein the second group of calibration terms comprises tracking terms.

18. The calibration tool of claim 13, wherein the calibration tool, when determining the second group of calibration terms from the load match values and the first group of calibration terms is configured to:

modify the first group of calibration terms according to the load match values to generate a modified first group of calibration terms; and utilize the load match values and the modified first group of calibration terms to determine the second group of calibration terms.

* * * * *